United States Patent
Podlipec et al.

(10) Patent No.: US 6,244,798 B1
(45) Date of Patent: Jun. 12, 2001

(54) DRILL OR MILLING HEAD

(75) Inventors: Milan Podlipec; Bostjan Podlipec, both of Vrhnika; Janez Zepic, Ljubljana, all of (SI)

(73) Assignee: PMV D.O.O., Trzic (SI)

( * ) Notice: Subject to any disclaimer, the term of this patent is extended or adjusted under 35 U.S.C. 154(b) by 0 days.

(21) Appl. No.: 09/341,094

(22) PCT Filed: Nov. 2, 1998

(86) PCT No.: PCT/IB98/02142

§ 371 Date: Aug. 24, 1999

§ 102(e) Date: Aug. 24, 1999

(87) PCT Pub. No.: WO99/22897

PCT Pub. Date: May 14, 1999

(30) Foreign Application Priority Data

Nov. 5, 1997  (DE) .............................. 197 48 735

(51) Int. Cl.[7] .................. B23C 9/00; B23B 5/22
(52) U.S. Cl. ................... 409/234; 279/50; 279/74; 279/134; 408/240
(58) Field of Search .................... 409/234, 232; 408/238, 239 R, 240; 279/50, 57, 74, 134, 135, 142

(56) References Cited

U.S. PATENT DOCUMENTS

| | | | |
|---|---|---|---|
| 2,370,729 | * | 3/1945 | Hoppe .............................. 409/234 X |
| 2,466,651 | * | 4/1949 | Zagar ..................................... 279/50 |
| 2,655,826 | * | 10/1953 | Goldsby ............................ 409/234 X |
| 3,095,205 | * | 6/1963 | Farncworth ............................. 279/74 |
| 5,921,730 | * | 6/1999 | Young et al. ......................... 409/182 |
| 5,997,225 | * | 12/1999 | Young et al. ......................... 409/182 |
| 6,045,306 | * | 4/2000 | Buddendeck et al. ................ 409/182 |

FOREIGN PATENT DOCUMENTS

| | | | |
|---|---|---|---|
| 3434699 | * | 4/1986 | (DE) ..................................... 409/234 |
| 44 45 597 A1 | | 6/1996 | (DE) . |
| 44 45 598 A1 | | 8/1996 | (DE) . |
| 297 15 257 01 | | 1/1998 | (DE) . |
| 0244203A | | 11/1987 | (EP) . |
| 0 761 350 A1 | | 3/1997 | (EP) . |

* cited by examiner

*Primary Examiner*—William Briggs
(74) *Attorney, Agent, or Firm*—Evenson, McKeown, Edwards & Lenahan, PLLC

(57) ABSTRACT

A drill or milling head (1), especially for printed circuit milling machines and engraving machines, including a collet chuck (27) which can be actuated by a rapid change mechanism. The drill or milling head includes a drive shaft which can be connected to a motor (3a). The collet chuck (27) is opened by axial displacement opposite a clamping sleeve (29), and the force necessary for the axial displacement is transmitted via a friction clutch (19, 23). As a result the drill or milling head cannot be damaged, and there is no danger of injury when changing the tool if the user fails to turn the motor (3a) off beforehand.

14 Claims, 1 Drawing Sheet

DRILL OR MILLING HEAD

BACKGROUND AND SUMMARY OF THE INVENTION

The invention relates to a drill or milling head. In particular, this drill or milling head is suited for machines which serve to produce fine structures, such as printed circuit milling machines and engraving machines. For the purpose of changing the tool in similar types of drill or milling heads, it is known to provide a rod for actuating collet chucks which is extended through a hollow drive shaft of the motor or of the drill or milling head and engages with the collet chuck by means of gearing. In order to open the collet chuck, the actuating rod is pushed in the direction of the collet chuck, either manually by means of a hand-activated knob found above the motor or pneumatically, which causes the collet chuck to be turned, i.e. screwed, and thereby opened. However, for this the motor must first be turned off. When this is forgotten, the drill or milling head is damaged since then the actuation rod, which is not rotating, comes into contact with the collet chuck, which is rotating. Then, it can even happen that the collet chuck comes completely off the drill or milling head and thereby poses the danger of injury to people.

A drill or milling head with a rapid change mechanism is known German Patent Document from DE 34 34 699 C2. However, in this drill or milling head it also is disadvantageous that during the changing of a tool which is in place, there is at least a danger of damaging the drill or milling head if the motor accidentally was not previously switched off.

SUMMARY OF THE INVENTION

Therefore, it is the object of the invention to provide a similar type of drill or milling head, with which if one neglects to first switch off the motor when changing the tool, there is no damage to the drill or milling head and no possibility of the danger of injury, and thereby to simplify servicing and make it safer.

Invention as described hereinafter.

Since the force necessary for the axial displacement of the collet chuck is transmitted via a friction clutch, it is not possible upon opening for a collet chuck which is accidentally still turning to come into interlocking contact with a part which is not rotating. Rather, the force of axial displacement is transmitted to the collet chuck or the shaft, which is fixed to the collet chuck, using a frictional contact via the friction clutch.

Preferably, the friction clutch is comprised of an axial part which can be moved with respect to the shaft and a part which can be displaced axially and which is fixed to the shaft, where both the parts have surfaces which conform to each other and which come into contact upon actuation of the rapid change mechanism. There, it is provided that both parts are supported pressing against the force of one spring each on their tool side. Thus, it is assured that, when in a state of rest, there is a distance between both parts and that when they are put together, in the eventuality that the part which is fixed to the shaft is turning, only friction which doesn't cause damage to a drill or milling head will occur between the surfaces.

In accordance with a preferred embodiment of the invention, the part which can be moved with respect to the shaft is cylindrical and is located concentrically with respect to the shaft and has, on the end near the motor, a ring-shaped shoulder. The part which is fixed to the shaft is an annular seal with an encircling fitting strip. On the ring-shaped shoulder and the encircling fitting strip, the conforming surfaces are designed flat and vertical with respect to the shaft.

The rapid change mechanism can be actuated manually by means of a handle. There, it can also be provided that the handle can be locked in the position in which the collet chuck is open. This provides the advantage that the operator has both hands free for handling the drill or milling tool. In contrast, when the rapid change mechanism of the prior art is actuated manually, the actuation knob must remain pressed throughout the whole replacement process.

The handle can, for instance, be a lever which has a handle section and a functional section, which is located inside the housing of the drill or milling head. There, it is provided that this functional section of the lever forms an acute angle with a horizontal plane when in resting position and a right angle with the shaft when in an actuating position, and furthermore is adjacent on the side near the motor to a stationary surface of the drill or milling head and is adjacent on the side near the tool to the part which is moveable with respect to the shaft. When in the actuating position, the functional section of the lever has a larger maximal extension in the axial direction than in the resting position. Thus it is that when the lever is moved from its resting position to its actuating position, the part of the friction clutch which is moveable with respect to the shaft is pushed to the end of the drill or milling head which is near the tool, and the shaft or collet chuck is thereby pushed with it, as described in further detail below, in order to thus bring about the opening of the collet chuck.

The functional section of the lever is preferably ring-shaped and arranged concentrically with respect to the shaft. If the exterior diameter of the functional section is equal to the interior diameter of the housing and the exterior of the functional section is curved convexly, it can be that this is adjacent to the housing of the drill or milling head at every place along its total circumference, excluding the region where the handle section is located. In this way, the lever can only be moved in its angular placement with respect to the shaft and if necessary for locking can be turned slightly around the axial direction of the drill or milling head, but aside from this is stationary. The handle section extends through an opening in the housing.

The maximum extension of the functional section in the axial direction, which can change depending on its position, is preferably achieved in that on the functional section of the lever, on the same side as the tool, in the plane which is perpendicular to the longitudinal axis of the lever and in which the shaft lies when the lever is in actuating position, a cam is disposed on each side of the shaft and another cam is disposed on the same side as the motor, across from the handle section of the lever. The two cams on the tool side and the cam on the motor side are thus staggered at 90°. Therefore, the functional section, when in a horizontal position, i.e. in the actuating position, has a larger axial extension than in the tilted position of the resting position.

Upon movement of the lever from its resting position to its actuating position, the two cams on the tool side press against a stopping surface of the part which is moveable in the axial direction with respect to the shaft. This then pushes against the ring seal, which is affixed to the shaft. Through actuation of the lever, the shaft is thus pushed towards the tool-side end of the drill or milling head. Along with the shaft, the collet chuck is also displaced with respect to the clamping sleeve. As a result, the collet chuck opens, whose gripping arms lie, in the end section of the clamping sleeve, against an inner surface of the clamping sleeve which tapers conically up to the motor in an axial direction.

The rapid change mechanism can also be actuated pneumatically.

It can be provided that, in order to enable an easy separation of the motor and drill or milling head, a drive shaft of the motor and the shaft of the drill or milling head are connected to each other via a clutch. Preferably, the clutch involved is an elastic clutch, so that oscillations in the axial direction are absorbed.

If necessary, the drill or milling head can be connected to different motors very easily via a clutch plate. The result is a modular building method for a drill or milling head which constitutes a completely autonomous unit with a mechanism for quickly and safely changing the tool.

BRIEF DESCRIPTION OF THE DRAWINGS

In the drawing, an illustrative embodiment of the invention is shown and is subsequently explained in detail. Shown are.

DETAILED DESCRIPTION OF THE DRAWINGS

Figure 1:
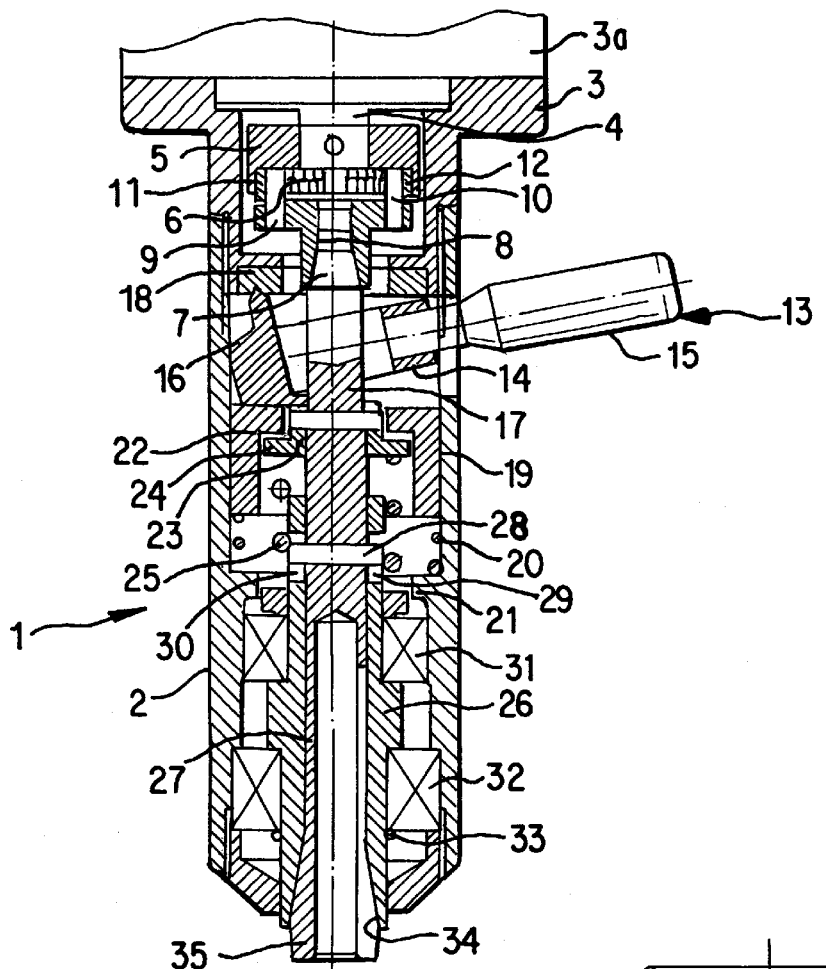
FIG. 1, a sectional view of the drill or milling head.

A drill or milling head 1 has a housing 2 with a flange portion 3, by which means a motor 3a can be attached. A cap 5 is fixed on the drive shaft 4 of the motor 3a which contains an elastic clutch plate 6. The clutch plate 6 lies across from a plate-like cap 8 which is affixed to the drive shaft 7 of the drill or milling head 1 and which forms, together with the cap 5 of the motor drive shaft 4 and two connecting pins 9 and 10, a clutch between the driving shafts 4 and 7 of the motor 3a and of the drill or milling head 1. The connecting pins 9 and 10 are fixed in the cap 8 of the shaft 7 of the drill or milling head 1 and protrude into the recesses 11 and 12 of the clutch plate 6.

Further, the drill or milling head 1 has a lever 13 with a functional section 14 located inside the housing 2 and a handle section 15 which protrudes from the housing 2. The functional section 14 is ring-shaped and concentric with respect to the shaft 7 of the drill or milling head 1. Additionally, the functional section 14 has a diameter such that it is convexly curved on its exterior surface such that it is adjacent to the housing 2 of the drill or milling head 1 at every place along its total circumference, excluding the region where the handle section 15 is located. A cam 16 is located on the side of the functional section 14 facing the motor 3a. Two additional cams 17, only one of which is pictured, are located on the opposite side of the functional section 14. These two cams 17 lie in a plane which surrounds the shaft 7 at 90° with respect to the cross-sectional plane. On the side facing the motor, the functional section 14 is adjacent to a stationary ring 18, on the tool side to a cylindrically-shaped part 19, moveable in the axial direction, which on the tool side is supported via a spring 20 pressing against a projection 21 of the housing 2. On its end facing the motor 3a, the part 19 has a ring-shaped shoulder 22 which is at a right angle to the wall of part 19.

A collar 23 with an encircling fitting strip 24 is affixed to the shaft 7. The fitting strip 24 is arranged parallel to the shoulder 22 and formed such that the flat surfaces opposite each other of the shoulder 22 and of the fitting strip 24 come into contact when the part 19 is displaced towards the tool end of the drill and milling head. The collar 23 is supported on its side near the tool via a spring 25 pressing against a clamping sleeve 26. The clamping sleeve 26 encloses a section of the shaft 7 and, excepting a small end region, a complete collet chuck 27, which the shaft 7 turns into. A pin 28, extending crosswise through the shaft 7 protrudes from both sides of the shaft 7 into each of two elongated holes 29 or 30 in the clamping sleeve 26 which run parallel to the shaft 7.

The clamping sleeve 26 rests on two pivot bearings 31 and 32 and is protected against axial displacement by a clamping ring 33. In its end section, the clamping sleeve 26 has an inner surface 34 which tapers conically up to the motor 3a in an axial direction. Gripping arms 35 of the collet chuck 27, when it is closed, lie against this inner surface 34.

Figure 2:
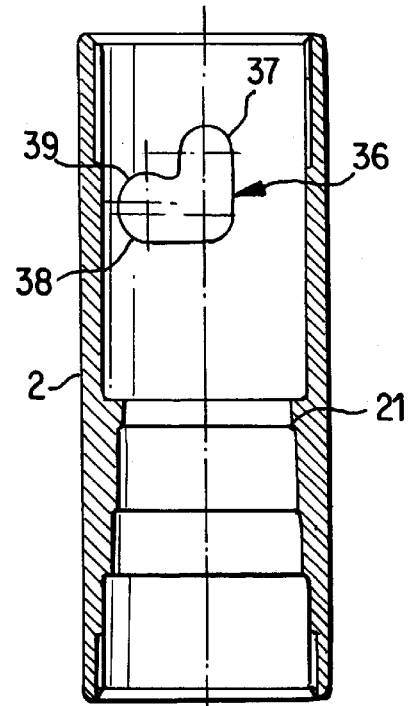
FIG. 2, a sectional view of the housing of the drill or milling head which shows the locking device for a handle for the rapid change mechanism.

As shown in FIG. 2, in this embodiment of the invention, a lock is provided for the lever 13 in its actuating position, i.e. in the open state of collet chuck 27. For this, an opening 36, essentially shaped as a right angle, is provided in the housing 2 for the lever 13, where one leg 37 is arranged in an axial direction. The second leg 38, which on its outer end has a bulge 39 going in the direction of the leg 37, provides a notch for the lever 13.

If a tool (not shown) is in place in the inventive drill or milling head 1, the lever 13 is in its resting position, shown in FIG. 1. In this position, in which the functional section 14 of the lever 13 shows its smallest axial expansion, it is held by the force of the spring 20, transmitted through the cylindrical part 19. If the lever 13 is moved to its horizontal position, the axial expansion of the functional section 14 increases, whereby the moveable part 19 is displaced towards the tool end of the drill or milling head. Thus, the two flat surfaces opposite each other of the shoulder 22 and of the fitting strip 24 make contact such that the collar 23 is also displaced. Since this is affixed to the shaft 7, the shaft 7 and the collet chuck 27, directly adjacent to the shaft 7, also move towards the tool end of the drill or milling head 1. Because of the resulting displacement of the collet chuck 27 with respect to the clamping sleeve 26, stationary in the axial direction, the frictional connection between the conical inner surface 34, the clamping sleeve 26 and the gripping arm 35 of the collet chuck 27 is released, whereby the tool held by the gripping arms 35 is loosened.

The pin 28 and the elongated holes 29 and 30 represent a mutual movement device which enables the clamping sleeve 26 to always turn with the shaft 7, i.e. no friction occurs between the two parts. The elongated holes 29 and 30 ensure thereby that the shaft 7 can be axially displaced with respect to the clamping sleeve 26.

When the lever 13 is moved to its actuation position, the connecting pins 9 and 10 of the drive shaft clutch also move in the direction of the tool-side end of the drill and milling head 1. However, in this these do not come completely out of the recesses 11 and 12, so that the clutch doesn't disengage.

In order to be locked, the lever 13 in its actuating position is turned slightly around the axial direction of the drill and milling head 1, such that it is received and held by the bulge 39.

If the motor 3a is accidentally not switched off before actuation of the lever 13, no damage can occur to the drill or milling head 1 or no danger of injury to people can arise since the contact surfaces of the cylindrical part 19 and of the collar 23 are designed for the frictional heat which then results and the collet chuck 27 can not come off the shaft 7.

What is claimed is:

1. A drill or milling head comprising:

a shaft operatively connected to a motor;

a collet chuck forming a portion of the shaft;

a clamping sleeve surrounding the collet chuck; and a rapid change mechanism for exerting a force to the collect clutch via a friction clutch to axially displace the collet chuck relative to the clamping sleeve and open the collet chuck;

wherein the friction clutch includes a cylindrical axial part, engageable with the rapid change mechanism and movable with respect to the shaft, and a collar which is affixed to the shaft and which can be displaced axially by the axial part.

2. A drill or milling head in accordance with claim 1, wherein each of the axial part and the collar have surfaces which conform to and come into contact with one another and are each supported on a tool side of the drill or milling head by an opposing force of a spring.

3. A drill or milling head in accordance with claim 2, wherein the axial part which is moveable with respect to the shaft is arranged cylindrically and concentrically with respect to the shaft and has an annular shoulder on the same end as the motor, and the collar which is affixed to the shaft includes an encircling fitting strip, and the conforming surfaces are designed flat and perpendicular with respect to the shaft.

4. A drill or milling head in accordance with claim 1, wherein the rapid change mechanism has a handle for actuation.

5. A drill or milling head in accordance with claim 4, wherein the handle, in the position in which the collet chuck is open, can be locked in a notch in a housing of the drill or milling head.

6. A drill or milling head in accordance with claim 4, wherein the handle is a lever.

7. A drill or milling head in accordance with claim 2, wherein the rapid change mechanism comprises a lever including a handle section and a functional section which is located inside a housing of the drill or milling head and which in resting position forms an acute angle with a plane extending perpendicularly to a longitudinal axis of the drill or milling head and in an actuating position forms a right angle with the longitudinal axis of the drill or milling head, and additionally is adjacent on a motor side of the drill or milling head to a stationary surface of the drill or milling head and on the tool side to the collar which is moveable with respect to the shaft, said functional section of said lever in the actuating position having a larger maximum extension in the longitudinal direction than in the resting position.

8. A drill or milling head in accordance with claim 7, wherein the functional section of the lever is ring-shaped and concentric to the shaft.

9. A drill or milling head in accordance with claim 8, wherein the functional section has a diameter and is convexly curved on its exterior such that it is adjacent to the housing of the drill or milling head at every place along its circumference, excluding the region where the handle section is located.

10. A drill or milling head in accordance with claim 7, wherein on the functional section of the lever, on the tool side, in a plane which is perpendicular to the longitudinal axis of the lever and in which the shaft lies when the lever is in actuating position, a cam is disposed on each side of the shaft, and another cam is disposed on the same side as the motor across from the handle section of the lever.

11. A drill or milling head in accordance with claim 1, wherein the rapid change mechanism is actuated pneumatically.

12. A drill or milling head in accordance with claim 1, wherein the shaft of the drill or milling head is connected with a drive shaft of the motor via a clutch plate such that the drill or milling head forms an autonomous unit with the mechanism for quickly and safely changing the tool.

13. A drill or milling head in accordance with claim 12, wherein said clutch plate is an elastic clutch plate.

14. A drill or milling head in accordance with claim 1, wherein the drill or milling head can be connected to different motors via the clutch plate.

* * * * *